United States Patent [19]

Subramani

[11] Patent Number: 5,477,488

[45] Date of Patent: Dec. 19, 1995

[54] SYSTEM, A MEMORY AND A PROCESS HAVING BIT PROCESSING CIRCUITS ASSOCIATED WITH MEMORY FOR PRE-PROCESSING DATA READ BY A PROCESSOR

[75] Inventor: K. Subramani, Bangalore, Ind.

[73] Assignee: Texas Instruments Incorporated, Dallas, Tex.

[21] Appl. No.: 200,888

[22] Filed: Feb. 14, 1994

[51] Int. Cl.[6] .................................................. G11C 8/00
[52] U.S. Cl. .............................. 365/189.02; 365/189.03; 365/189.05; 365/230.01; 365/230.03; 395/427
[58] Field of Search ..................... 365/189.02, 189.03, 365/189.05, 230.01, 230.03, 63, 52, 230.08; 395/425

[56] References Cited

U.S. PATENT DOCUMENTS

| | | | |
|---|---|---|---|
| 5,262,991 | 11/1993 | Pope | 365/189.02 |
| 5,265,045 | 11/1993 | Nisho et al. | 365/63 |
| 5,278,801 | 1/1994 | Dresser et al. | 365/189.02 X |
| 5,307,469 | 4/1994 | Mann | 395/425 |
| 5,345,573 | 9/1994 | Bowdent, III et al. | 365/189.02 X |
| 5,383,154 | 1/1995 | Shibuya | 365/189.01 |

Primary Examiner—David C. Nelms
Assistant Examiner—Huan Hoang
Attorney, Agent, or Firm—Lawrence J. Bassuk; Leo N. Heiting; Richard L. Donaldson

[57] ABSTRACT

Bit processing circuits 100,102 and 104 on the substrate of memory circuits 24 perform bit operations on the data read from addressable storage locations 86 before producing the bit processed data from the memory. A system includes central processing unit circuits 22 on a substrate separate from the memory 24 and producing bit operation information in time multiplexed sequence on the address leads 32 or to normally not-connected leads (NC) on the memory substrate.

8 Claims, 5 Drawing Sheets

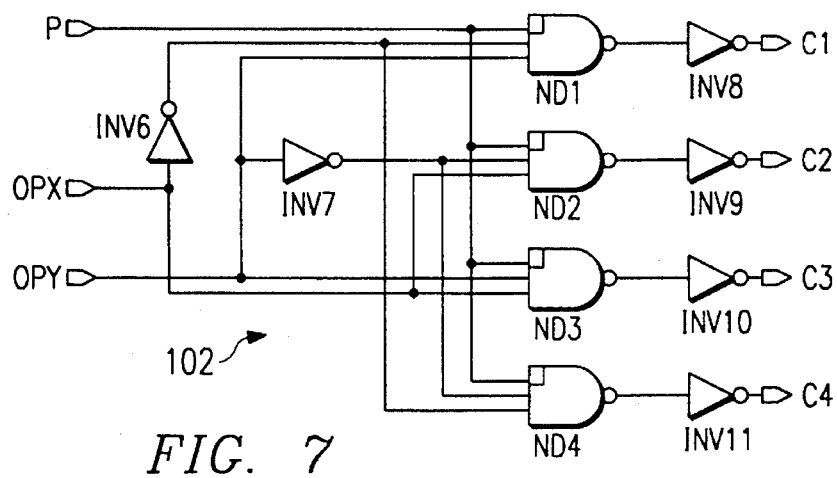
FIG. 7
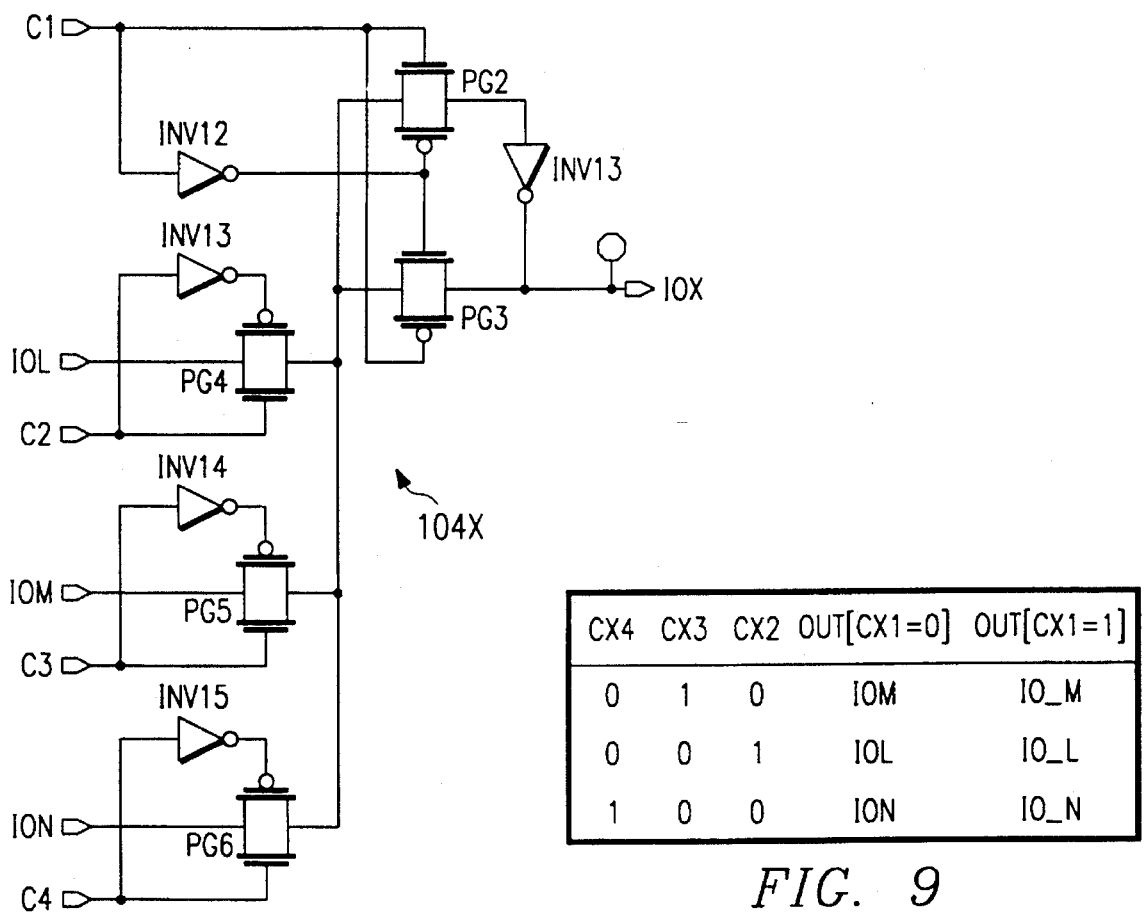
FIG. 8
| CX4 | CX3 | CX2 | OUT[CX1=0] | OUT[CX1=1] |
|---|---|---|---|---|
| 0 | 1 | 0 | IOM | IO_M |
| 0 | 0 | 1 | IOL | IO_L |
| 1 | 0 | 0 | ION | IO_N |
FIG. 9

5,477,488

SYSTEM, A MEMORY AND A PROCESS HAVING BIT PROCESSING CIRCUITS ASSOCIATED WITH MEMORY FOR PRE-PROCESSING DATA READ BY A PROCESSOR

FIELD OF THE INVENTION

This invention relates generally to electronic systems that have a processor on a semiconductor substrate for processing data and memory on a separate semiconductor substrate or substrates for storing data, and particularly relates to reducing the time required for processing data by locating some bit processing circuits on the memory semiconductor substrate to perform some pre-processing of data read from the memory by the processor.

DESCRIPTION OF THE RELATED ART

Central processing units (CPUs) available today are extremely fast and demand high speed memories to keep up with the processing speeds. A significant amount of the processing unit's time is spent in memory access, in terms of waiting time due to generation, transmission and reception of control and data signals transferred across the memory bus and inherent delays in accessing the array of memory cells. Some of the solutions proposed to overcome these limitations include parallel processing, high speed memory parts, and cache memory; these solutions improve the CPU-memory bandwidth but add cost to the system implementation or to the memory.

Considering a system using some of the fastest dynamic random access memory (DRAM) parts available, a memory read cycle requires about 50 nanoseconds to address, access and read a word of data from the part back to the CPU. The CPU then requires some time to process the word of data and another 50 nanosecond memory cycle to write the word of data back to the memory part. This executes a READ-MODIFY-WRITE cycle.

SUMMARY OF THE INVENTION

The claimed invention associates some basic bit arithmetic and logic operations with the memory part substrate to improve system operating times. Particularly, the bit processing circuits occur in the read data path from the storage array to the data output registers and affect data read from the array. This improves overall system performance because the processor receives pre-processed instead of raw data.

Bit operations are simple manipulations of the individual bits of data. They can include rotate right, rotate left, and invert, and their combinations, for example, rotate right and invert. Control or instruction signals for performing the bit manipulations are provided by the CPU contemporaneous with the addressing of the memory part to avoid affecting the normal memory part access times.

The CPU thus provides a row address, a column address and an opcode instruction to the memory or memory part. In return, the CPU receives the addressed data pre-processed according to the opcode instruction.

The bit manipulation operations constitute some of the most frequently used operations in the CPU. Their execution constitutes a large percentage of the CPU operating time and READ-MODIFY-WRITE operating time. Moving the bit operations to the memory part and manipulating the data internal to the memory as part of a data READ cycle thus improves the CPU-memory bandwidth. Moving these few bit operations to the memory parts frees the CPU for other operations and can significantly increase the operating speed of the CPU-memory system.

The invention provides a low cost solution to the stated problem with minimal increase to the cost of the memory parts. The size of the die remains substantially the same due to a minimal addition of bit processing logic. Accessing times remain substantially the same, especially if unassigned [NC] pins are used for passing the control or instruction signals to the parts. Many different types of memory parts can use this implementation of the memory part providing bit processed data instead of just raw data.

BRIEF DESCRIPTION OF THE DRAWING FIGURES

FIG. 7 is a schematic diagram of an opcode decoder circuit;

FIG. 8 is a schematic diagram of a bit operation circuit;

FIG. 9 is a truth table for the operation of the bit operation circuit;

DETAILED DESCRIPTION

Figure 1:
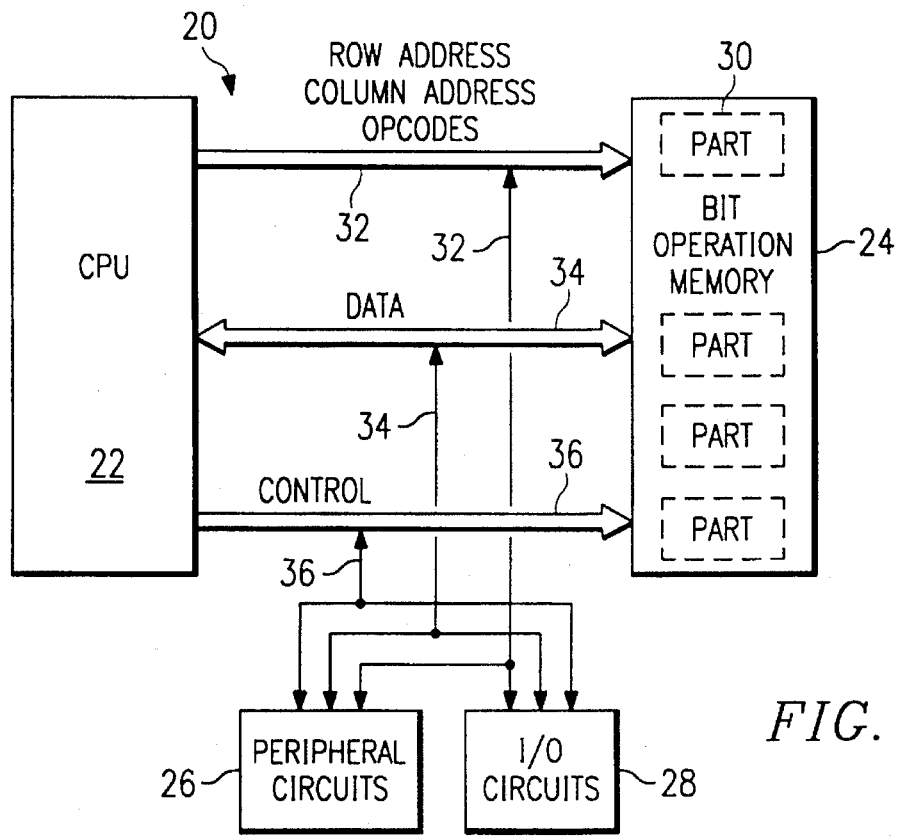
FIG. 1 is a simplified block diagram of a computer system including a central processing unit and memory according to one aspect of the invention.

In FIG. 1, computer system 20 comprises central processing unit 22, bit operation memory 24, peripheral circuits 26 and I/O circuits 28. Memory 24 contains circuits for performing bit operations on the contained data and can be formed of an integrated circuit on a single substrate or can be formed of plural integrated circuits on plural substrates, or parts 30, connected together in known manner. In system 20, the row addresses, column addresses and bit operation codes or bit opcode signals occur on a single set of leads 32 in time multiplexed order. The data signals occur on leads 34 and the control signals occur on leads 36. In this embodiment, the CPU passes the bit opcodes or instructions to the memory 24 and the memory receives the bit opcodes across the leads 32 after the time ordered row and column information. This avoids conflict with the normal operation of the memory 24.

Figure 2:
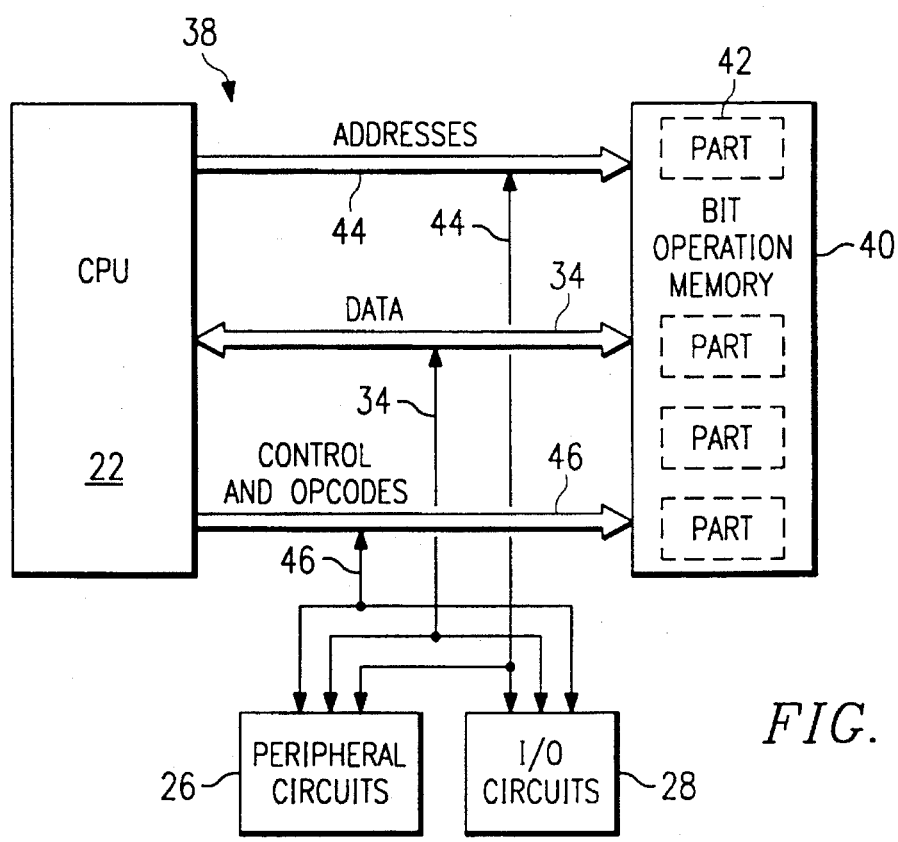
FIG. 2 is another simplified block diagram of a computer system including a central processing unit and memory according to another aspect of the invention.

In FIG. 2, computer system 38 comprises central processing unit 22, bit operation memory 40, peripheral circuits 26 and I/O circuits 28. Memory 40 also contains circuits for performing bit operations on the contained data and can be formed of an integrated circuit on a single substrate or can be formed of plural integrated circuits on plural substrates, or parts 42, connected together in known manner. In system 38, the row addresses and column addresses signals occur on a single set of leads 44 in normal time multiplexed order. The data signals occur on leads 34 and the control signals and bit opcodes occur on leads 46. In this embodiment, the CPU passes the bit opcodes or instructions to the memory 40 across the leads 46 on separate control leads connected to the normally not-connected (NC) leads on the memory 40 or parts 42. This avoids the transfer of the bit opcodes from interfering with the normal operation of the memory 40 or parts 42.

The present invention can be used in a family of DRAM devices constructed and arranged to contain 1,048,576 words of data having sixteen parallel bits in a word, also identified by the abbreviation 1M×16.

Figure 3:
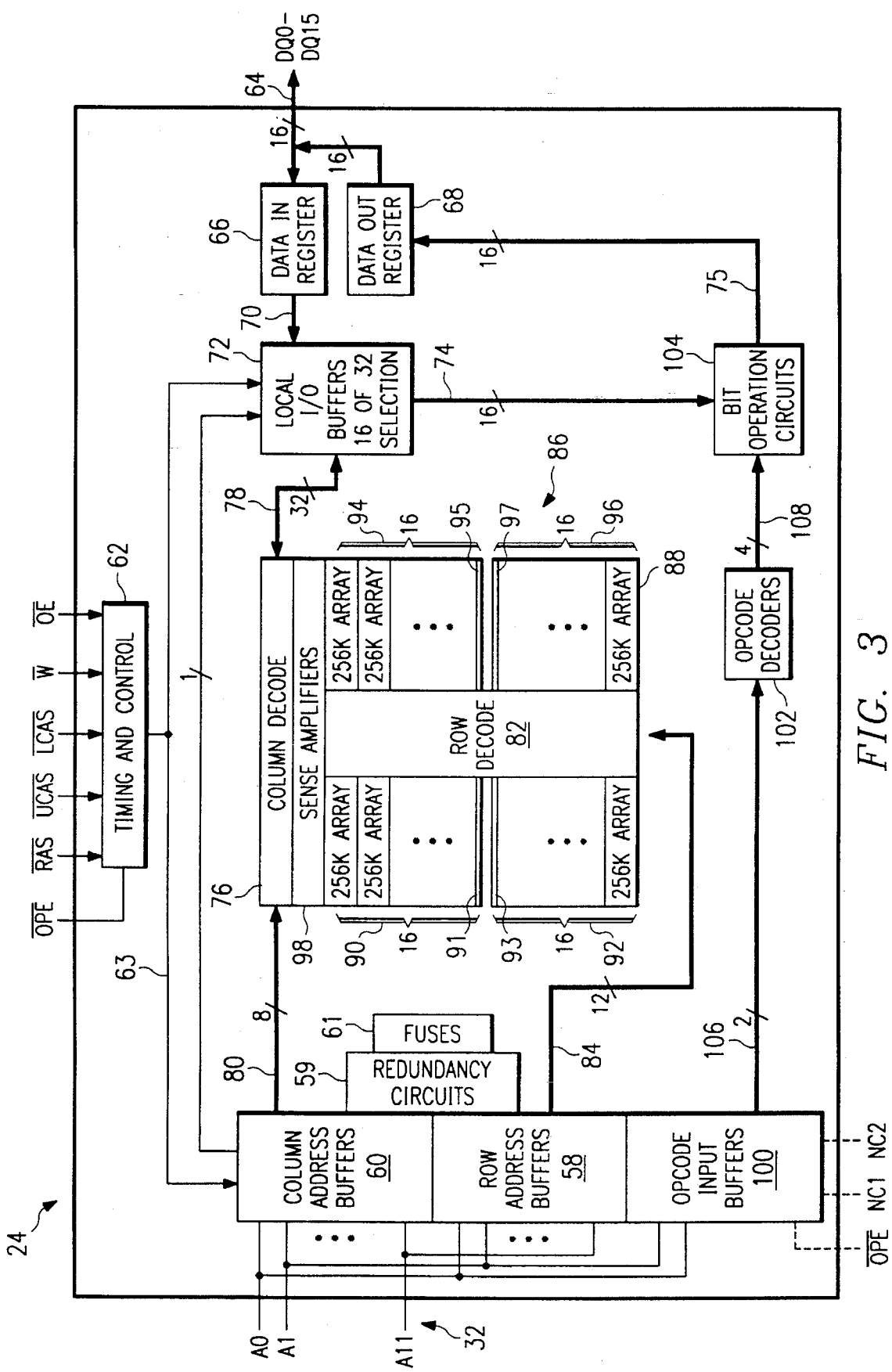
FIG. 3 is an idealized block diagram of a memory part implementing the invention.

In FIG. 3, memory 24 receives address signals A0–A11 in row address buffers 58 and column address buffers 60. The address signals become latched in the address buffers by use of control signals: Row Address Strobe, RAS_, Upper Column Address Strobe, UCAS_, Lower Column Address Strobe, LCAS_, Write, W_ and Output Enable, OE_, received in timing and control block 62. Leads 63 carry desired timing and control signals from block 62 to buffers 58 and 60.

Redundancy circuits 59 and fuse circuits 61 connect with the address information received in row and column buffers 58 and 60 to select redundant rows and columns of memory cells for replacing defective memory cells. The determination of fuses to be blown and left alone to select redundant memory cells occurs after testing. The part is fabricated and then tested; repairable parts are acted upon by such as a laser that blows appropriate fuses in fuse circuits 61 and selects redundant rows and columns of memory cells to produce a saleable part.

Data signals DQ0–DQ15 are carried in parallel on leads 64 to data in register 66 and data out register 68. Sixteen data signals pass in parallel across leads 70 from data in register 66 to the 16 local I/O buffers 72 and 16 data signals pass in parallel across I/O leads 74 and 75 from the 16 local I/O buffers 72 to the data out register 68. Thirty-two data signals pass in parallel from the local I/O buffers 72 to the column decoders 76 across leads 78. The local I/O buffers 72 also receive timing and control signals over leads 63 from timing and control block 62. Column decoders 76 receive 8 address signals in parallel across leads 80 from column address buffers 60. Row decoders 82 receive 12 address signals in parallel over leads 84 from row address buffers 58.

Column decoders 76 and row decoders 82 address individual memory cells in array 86, which includes 16,777,216 data bits configured in 1,048,576 (1M) words by 16 bits per word. Array 86 contains 64 subarrays, such as subarray 88, with each subarray containing 256K of data bits. Array 86 arranges the subarrays in four quadrants 90, 92, 94, and 96, with 16 subarrays in each quadrant. Each of the subarrays contain redundant memory cells arranged as redundant rows and redundant columns; these redundant memory cells are schematically represented at blocks 91, 93, 95, and 97. The redundant rows become selected by the row address signals received over leads 84 and the redundant columns become selected by the column address signals received over leads 80.

FIG. 3 depicts the subarrays in an idealized way between row decoders 82 and sense amplifiers 98. Other arrangements of the array, quadrants, subarrays and redundant cells are possible as desired. In the actual part, the row decoders can be arranged as desired, such as between the quadrants and the sense amplifiers can be located as desired, such as between the subarrays, or otherwise as desired. The data signals from the selected rows of data bits in the array parts pass through the sense amplifiers 98 to column decoders 76.

Control signals Write, W_, and Output enable, OE_, connect to timing and control block 62 to indicate and control the writing and reading of data signals from overall array 86.

Please understand that this text uses an underline character following the name or acronym for a signal to indicate the active low state. This facilitates text preparation using a word processor, even though the drawing may use an overscore to indicate the active low state.

Memory 24 also includes many other peripheral circuits to implement reading, writing and storage of data or information and to implement the bit operation feature. In particular, the circuits for implementing the bit operations include opcode input buffers 100, opcode decoders 102 and bit operation circuits 104. Memory 24 also receives a bit operation enable signal OPE_ in timing and control circuits 62 to facilitate executing the bit operation function.

Opcode input buffers 100 couple to the row address buffers 58 and the column address buffers 60 for receiving the opcodes from the CPU 22 over the A0–A11 address leads 32. This embodiment has the opcode input buffers 100 connected only to the address leads A0 and A1 for receiving two bit opcode signals OPX and OPY. The two bit opcode signals are binarily encoded to indicate one of four bit operations; additional connections to the address leads can be made as desired to receive additional opcode bits binarily or otherwise indicating bit operations to be performed in the memory 24.

The opcode decoders 102 receive two opcode signals from the opcode input buffers 100 over leads 106. Opcode decoders 102 decode the binary states of the two received opcode signals and produce four control signals on leads 108 to the bit operation circuits 104.

Bit operation circuits 104 connect to the path of data being read from the memory array 86 by being connected in series on the output data path between the local I/O buffers 72 and data output registers 68. In this way, the data being read from array 86 can be pre-processed in bit operation circuits 104 in response to the opcodes received from the CPU before the data is output from memory 24 and before the data is received by CPU 22.

Alternatively or optionally, the memory can receive the opcodes and enable signal through not-connected leads (NC), depicted in FIG. 3 by the dashed line leads extending between the signals OPE_, NC1 and NC2 and the opcode input buffers 100.

Figures 4, 5, 6:
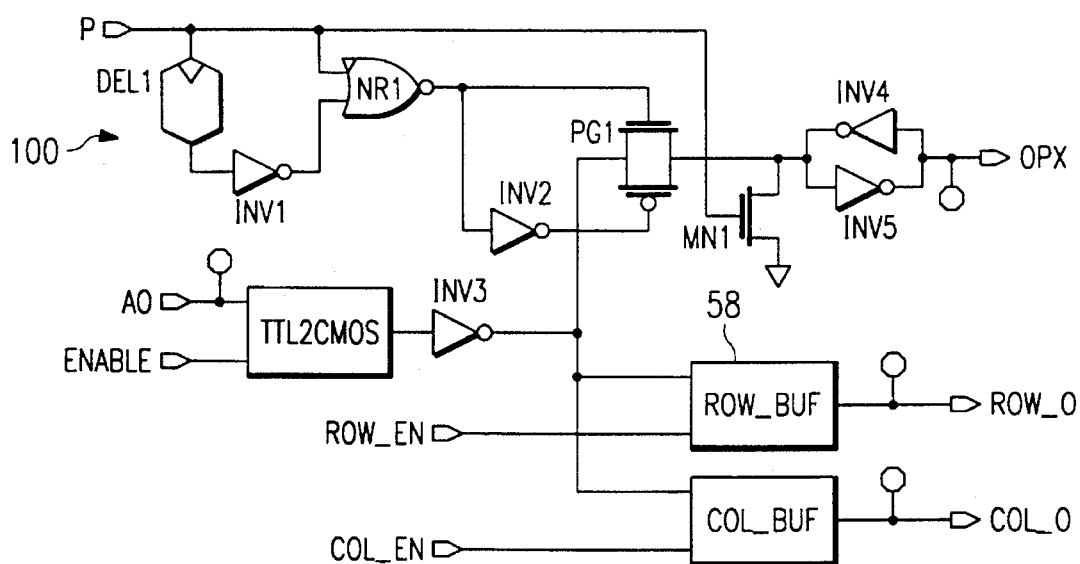
FIG. 4 is the outline and lead assignments of one form of a memory part package.
FIG. 5 is the outline and lead assignments of another form of a memory part package.
FIG. 6 is a schematic diagram of one opcode input buffer circuit.

In FIG. 4, a 42 lead plastic small outline J-lead (SOJ) surface mount package presents three not-connected leads NC at positions 11, 12 and 32. In FIG. 5, a 50/44 lead thin small outline package (TSOP) presents four normally not-connected leads NC at positions 11, 15, 16 and 36. The present invention contemplates using these unconnected leads NC for receiving a bit operation enable signal OPE_ and optionally two binary opcode signals OPX and OPY. This facilitates implementation of the present invention without changing any of the current lead assignment standards.

In FIG. 6, the opcode input buffers 100 connect with the column buffers 60 and row buffers 58. The A0 address lead and an ENABLE signal connect to the input of TTL level shifting circuits TTL2CMOS. The output of the TTL2CMOS circuits connect through an inverter inv3 to row address buffer circuits ROW_BUF and column address buffer circuits COL_BUF. The ROW_BUF circuits also receive an enable signal ROW_EN and produce the row address bit on their output at signal ROW_0. The COL_BUF circuits also receive an enable signal COL_EN and produce the column address bit on their output at signal COL_0. These circuits substantially comprise the row and column address buffers, generally indicated by numerals 58 and 60 in FIG. 3, for the one row bit and one column bit of address information sequentially received on address line A0.

In the opcode input buffers 100, an inactive high signal P connects to the inputs of delay circuits del1, nor gate nr1 and the gate of transistor mn1. The output of delay circuits del1 connect through inverter inv1 to the other input of nor gate nr1. The output of nor gate nr1 connects directly to the gate of the N-channel transistor in pass gate pg1 and through inverter inv2 to the gate of the P-channel transistor in pass gate pg1. One side of the pass gate pg1 connects to the output of inverter inv3 and the other side of the pass gate connects to the output of inverter inv4 and the input of inverter inv5. The transistor mn1 extends between the other side of the pass gate to circuit ground. Inverters inv4 and inv5 form a latch inv4–inv5. The output of inverter inv5 and the input of inverter inv4 form the output signal OPX of the opcode input buffer 100 for the A0 address lead.

The signal P being inactive high turns on the transistor mn1. This resets the latch inv4–inv5 and causes the output signal OPX to be inactive high, regardless of the state or changes on the A0 address lead. When the opcode is valid on the A0 address lead, as indicated by the signal OPE going low, the P signal transitions low to turn off transistor mn1, enable nor gate nr1 and start operation of delay del1. This causes generation of a pulse through nor gate nr1 and inverter inv2 to open pass gate pg1 and allow the logic state on the A0 address lead to propagate through to and set latch inv4–inv5. At the end of the pulse from nor gate nr1, the pass gate pg1 closes and the state of the output signal OPX remains until the P signal returns inactive high to reset the latch inv4– inv5. The circuits from the P signal through the output signal OPX represent one of the opcode input buffer circuits 100. A like set of circuits exist to couple the opcode signal on address lead A1 to an output signal OPY.

In FIG. 7, the opcode decoder circuits 102 binarily decode the opcodes OPX and OPY to one of four control signals C1, C2, C3 and C4 through inverters inv6 through inv11 and nand gates nd1 through nd4. The P signal acts as an enable signal for the decoding through the nand gates.

In FIG. 8, the bit operation circuits 104 effect the bit operations indicated by the bit opcodes. One of these circuits 104X will exist for each of the sixteen data bits passing from the local I/O buffers 72 to the data output registers 68. The circuit 104X receives as an input a data signal IOM corresponding to the output signal IOX. The circuit 104X also receives as inputs data bit signals IOL and ION, respectively, to the right and to the left of the data bit signal IOM. This provides the data for effecting a shift right and shift left bit operation.

Control signal C1 connects directly to the gate of the N-channel transistor in pass gate pg2 and to the gate of the P-channel transistor in pass gate pg3. Control signal C1 connects through inverter inv12 to the gate of the P-channel transistor of pass gate pg2 and to the gate of the N-channel transistor in pass gate pg3. The output of pass gate pg2 connects through inverter inv13 to form signal IOX on lead 110, which forms one of the data lines 75 in FIG. 3. The output of pass gate pg3 directly produces the IOX signal on lead 110. Pass gates pg2 and pg3 perform a binary inversion according to the received opcodes.

Control signal C2 connects directly to the gate of the N-channel transistor in pass gate pg4 and indirectly through inverter inv13 to the gate of the P-channel transistor in pass gate pg4. The input of pass gate pg4 receives data bit IOL from the local I/O buffers 72 on leads 74. The output of pass gate pg4 connects to the inputs to pass gates pg2 and pg3.

Control signal C3 connects directly to the gate of the N-channel transistor in pass gate pg5 and indirectly through inverter inv14 to the gate of the P-channel transistor in pass gate pg5. The input of pass gate pg5 receives data bit IOM from the local I/O buffers 72 on leads 74. The output of pass gate pg5 connects to the inputs to pass gates pg2 and pg3.

Control signal C4 connects directly to the gate of the N-channel transistor in pass gate pg6 and indirectly through inverter inv15 to the gate of the P-channel transistor in pass gate pg6. The input of pass gate pg6 receives data bit ION from the local I/O buffers 72 on leads 74. The output of pass gate pg6 connects to the inputs to pass gates pg2 and pg3.

In FIG. 9, the truth table for the operation of the bit operation circuits 104 indicates that any one control signal C2 C3 and C4, corresponding to that bit operation circuit 104X, going high passes the respective data bit IOL, IOM and ION to the inputs to the pass gates pg2 and pg3. The control signal C2 thus effects a shift right operation while the control signal C4 effects a shift left operation. Depending upon the control signal C1 being low or high, the output signal IOX takes a normal or inverted state. In this manner the bit operation circuits affect bit operations on data being read from array 86 to CPU 22. The bit operation circuits thus pre-process the data before the data leaves the memory 24 and before the data gets to the CPU 22.

Figure 10:
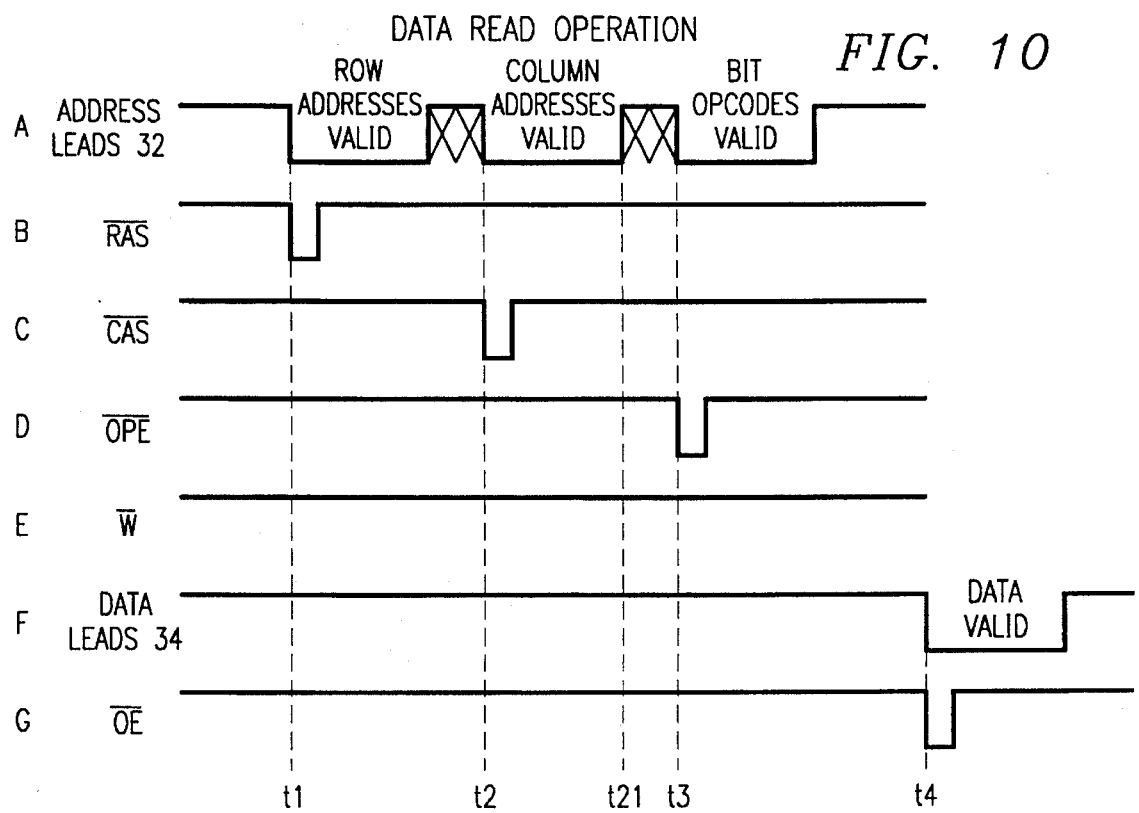
FIG. 10 is a diagram depicting the relative timing relationships of signals occurring between the central processing unit and the memory in the configuration of FIG. 1.

In FIG. 10, the timing of a data read operation, in the configuration depicted in FIG. 1, has the central processing unit seeking to read bit processed data from the memory. At time t1 the central processing unit applies the row address signals on the address leads 32. The processor also asserts the row address strobe RAS_ at time t1 to indicate to the memory that the row address signals are valid. At a later time t2, the processor asserts the column address signals on leads 32 and asserts the column address strobe CAS_. This describes standard operation of a dynamic random access memory part.

After time t21, the address leads become unused until the assertion by the processing unit of the next set of row address, which occurs after reading data from the memory part. The disclosed invention uses the address leads in this interval to convey bit opcodes from the processing unit to the memory. At time t3 and on the same address leads 32, the processor thus asserts the bit opcodes and asserts the opcode enable signal OPE_. The memory part then gets the addressed data and executes the indicated bit operation. Later at time t4, the memory asserts the valid, pre-processed data on data leads 34 in response to the processor asserting the output enable signal OE_.

The disclosed processor and memory system thus operate together and in accordance with present standard conventions for address and data transfer to effect bit processing of the data in the memory. The bit processing generally occurs in the memory in the interval after receiving the column address and before outputting valid data. Particularly, the bit processing occurs as the data leaves the sense amplifiers and travels to the data output buffers. This occurs with the simple gating circuits in the disclosed bit operation circuits.

Figure 11:
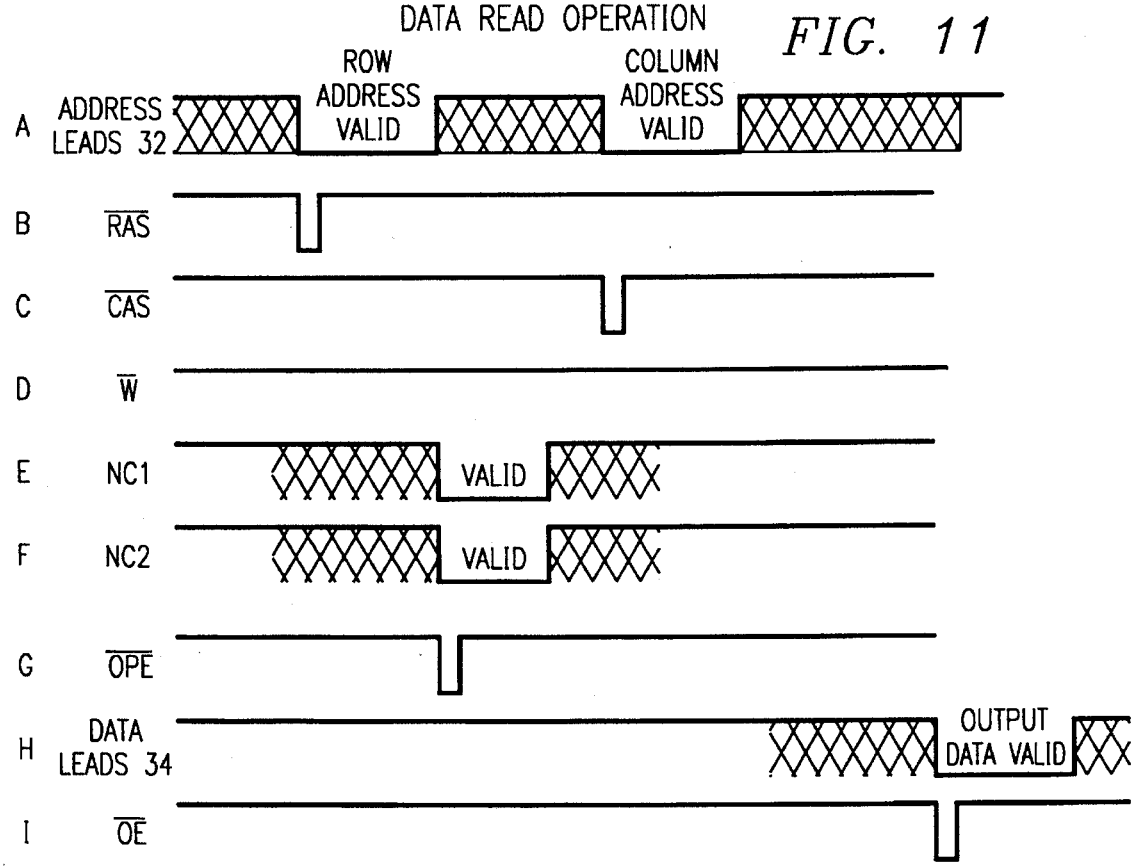
FIG. 11 is a diagram depicting the relative timing relationships of signals occurring between the central processing unit and the memory in the configuration of FIG. 2.

In FIG. 11, for the configuration of FIG. 2, the bit opcode signals NC1, NC2 and OPE_ can occur independent of the standard timing of addressing and data transfer in a dynamic random access memory part. The independence results from using normally not used leads. The only constraint occurs as requiring the bit opcode information to be received early enough to effect the indicated bit operation. The opcode signals NC1 and NC2 and the control signal OPE_ occur independent of the row and column addresses and strobe signals RAS_ and CAS_.

The claimed invention may be practiced other than as specifically claimed. For example, the memory part can be arranged as desired. The bit operation circuits can be connected in the read data path at a different location. The bit operation circuits can perform other bit operations than shift and invert. Other specific bit operations or manipulations can be done in addition to or in place of the disclosed bit operations. Other signals and circuits can be used for those disclosed to perform the described functions. The bit operation circuits can be connected in the write data path of the memory part and the bit operations can occur during a write operation. The memory part can be a random access memory or other type of memory such as a static RAM, a ROM or a programmable ROM.

I claim:

1. A computer system comprising:
   A. central processing unit circuits formed on a substrate, the central processing unit circuits asserting data, address information and bit operation information and receiving bit processed data; and
   B. memory circuits formed on at least one substrate separate from the substrate of the central processing unit circuits, the memory circuits having terminals coupled to the data, address information and bit operation information of the central processing unit circuits and having an array of addressable locations for storing data, the memory circuits also having a data path extending between the terminals and the array and the memory circuits conveying data over the data path in response to the address signals, the memory circuits including operation circuits connected to the data path for operating on the data in response to the bit operation information from the central processing unit.

2. The system of claim 1 in which the central processing unit circuits produce the bit operation information in time multiplexed sequence with the data and address information.

3. The system of claim 1 in which the memory circuits include normally not-connected leads that receive the bit operation information.

4. A memory device comprising:
   A. a substrate;
   B. input terminals on the substrate for receiving address information and data operation information;
   C. at least one array of storage locations on the substrate for storing data at certain addressable locations indicated by the address information;
   D. data terminals on the substrate for conveying data to and from the substrate;
   E. a data path extending and conveying data between the data terminals and the at least one array of storage locations; and
   F. operation circuits for processing the data conveyed on the data path in response to the received data operation information.

5. The memory of claim 4 in which the input terminals receive the address information and the data operation information in time multiplexed sequence.

6. The memory of claim 4 in which the input terminals receive the data operation information on normally not-connected terminals.

7. A process of conveying data in a memory device, comprising:
   A. providing a semiconductor substrate having terminals for receiving address information, for sending and receiving data and for receiving data operation information, the substrate also having addressable storage locations containing data;
   B. conveying data between the addressable storage locations and substrate terminals in response to the address information; and
   C. processing the conveyed data between the addressable storage locations and the substrate terminals in response to the data operation information.

8. The process of claim 7 in which the conveying includes reading data from the addressable locations.

* * * * *